United States Patent
O'Brien et al.

(10) Patent No.: US 11,430,943 B2
(45) Date of Patent: Aug. 30, 2022

(54) MAGNETIC TUNNEL JUNCTION (MTJ) DEVICES WITH A SYNTHETIC ANTIFERROMAGNET (SAF) STRUCTURE INCLUDING A MAGNETIC SKYRMION

(71) Applicant: Intel Corporation, Santa Clara, CA (US)

(72) Inventors: Kevin O'Brien, Portland, OR (US); Kaan Oguz, Portland, OR (US); Noriyuki Sato, Hillsboro, OR (US); Charles Kuo, Hillsboro, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 830 days.

(21) Appl. No.: 16/022,561

(22) Filed: Jun. 28, 2018

(65) Prior Publication Data
US 2020/0006628 A1    Jan. 2, 2020

(51) Int. Cl.
*H01L 43/02* (2006.01)
*H01F 10/32* (2006.01)
(Continued)

(52) U.S. Cl.
CPC ............ *H01L 43/02* (2013.01); *G11C 11/161* (2013.01); *H01F 10/3254* (2013.01);
(Continued)

(58) Field of Classification Search
CPC ....... H01L 43/02; H01L 27/228; H01L 43/10; H01L 43/12; H01F 10/3254;
(Continued)

(56) References Cited

U.S. PATENT DOCUMENTS 8,796,797 B2   8/2014   Doyle et al.
9,853,206 B2   12/2017  Pinarbasi et al.
(Continued)

FOREIGN PATENT DOCUMENTS

JP    2012043913       3/2012
WO    WO-2017151735 A1 *  9/2017  ......... G11C 11/1673

OTHER PUBLICATIONS

Zhang et al. (Zhang, X., Zhou, Y. & Ezawa, M. Magnetic bilayer-skyrmions without skyrmion Hall effect. Nat Commun 7, 10293 (2016). https://doi.org/10.1038/ncomms10293, published Jan. 19, 2016) (Year: 2016).*

(Continued)

*Primary Examiner* — Jami Valentine Miller
(74) *Attorney, Agent, or Firm* — Essential Patents Group, LLP

(57) ABSTRACT

A magnetic tunneling junction (MTJ) memory device including a free and fixed (reference) magnet between first and second electrodes, and a synthetic antiferromagnet structure (SAF) structure between the fixed magnet and one of the electrodes. The SAF structure includes a magnetic skyrmion. Two magnetic skyrmions within a SAF structure may have opposing polarity. A SAF structure may further include a coupling layer between two magnetic layers, as well as interface layers separated from the coupling layer by one of the magnetic layers. The coupling layer may have a spin-orbit coupling effect on the magnetic layers that is of a sign opposite that of the interface layers, for example to promote formation of the magnetic skyrmions.

20 Claims, 11 Drawing Sheets

(51) Int. Cl.
*G11C 11/16* (2006.01)
*H01L 43/12* (2006.01)
*H01F 41/30* (2006.01)
*H01L 27/22* (2006.01)
*H01L 43/10* (2006.01)

(52) U.S. Cl.
CPC ..... *H01F 10/3272* (2013.01); *H01F 10/3286* (2013.01); *H01F 41/302* (2013.01); *H01L 27/228* (2013.01); *H01L 43/10* (2013.01); *H01L 43/12* (2013.01)

(58) Field of Classification Search
CPC ............. H01F 10/3272; H01F 10/3286; H01F 41/302; G11C 11/161
USPC ........................................................ 257/421
See application file for complete search history.

(56) References Cited

U.S. PATENT DOCUMENTS

| | | |
|---|---|---|
| 10,032,978 B1 | 7/2018 | Schabes et al. |
| 10,672,976 B2 | 6/2020 | Pinarbasi et al. |
| 10,720,572 B1 | 7/2020 | Fitelson et al. |
| 2013/0140513 A1 | 6/2013 | Sheng-Chih et al. |
| 2016/0225817 A1 | 8/2016 | Machkaoutsan et al. |
| 2016/0260892 A1* | 9/2016 | Tahmasebi ............ G11C 11/161 |
| 2017/0033742 A1 | 2/2017 | Akerman |
| 2017/0178747 A1 | 6/2017 | Tokunaga et al. |
| 2017/0178748 A1 | 6/2017 | Nagaosa et al. |
| 2018/0047894 A1 | 2/2018 | Pinarbasi et al. |
| 2018/0248110 A1 | 8/2018 | Kardasz et al. |
| 2018/0301266 A1 | 10/2018 | Ou et al. |
| 2019/0131049 A1 | 5/2019 | Buttner et al. |
| 2019/0206466 A1 | 7/2019 | Schabes et al. |
| 2020/0006628 A1 | 1/2020 | O'Brien et al. |
| 2020/0357983 A1* | 11/2020 | Zhao ...................... H01L 43/08 |
| 2021/0013397 A1 | 1/2021 | O'Brien et al. |

OTHER PUBLICATIONS

Dohi, T., DuttaGupta, S., Fukami, S. et al. Formation and current-induced motion of synthetic antiferromagnetic skyrmion bubbles. Nat Commun 10, 5153 (2019). https://doi.org/10.1038/s41467-019-13182-6 (Year: 2019).*

Legrand, W., Maccariello, D., Ajejas, F. et al. Room-temperature stabilization of antiferromagnetic skyrmions in synthetic antiferromagnets. Nat. Mater. 19, 34-42 (2020). https://doi.org/10.1038/s41563-019-0468-3 (Year: 2020).*

R. Tomasello, V. Puliafito, E. Martinez, A. Manchon, M. Ricci, M. Carpentieri, G. Finocchio, Performance of synthetic antiferromagnetic racetrack memory: domain wall vs skyrmion, arXiv:1610.00894v2 [cond-mat.mtrl-sci] (Year: 2016).*

Fert, Albert, et al., "Skyrmions on the track", Nature Nanotechnology, vol. 8, Mar. 2013, 5 pgs.

Kang, Wang, et al., "Skyrmion-Electronics: An Overview and Outlook", Proceedings of the IEEE, vol. 104, No. 10, Oct. 2016, 22 pgs.

Iwasaki, Junichi, et al., "Universal current-velocity relation of skyrmion motion in chiral magnets", Nature Communications, DOI: 10,1038/ncomms2442, 2013, 8 pgs.

Jabeur, Kotb, et al., "High Performance Spin-Orbit-Torque (SOT) Based Non-volatile Standard Cell for Hybrid CMOS/Magnetic ICs", Computer Science and Information Technology, DOI: 10,13189/csit.2017.050301, 2017, 6 pgs.

Rosch, Achim, "Moving with the current", Nature Nanotechnology, vol. 8, Mar. 2013, 2 pgs.

* cited by examiner

MAGNETIC TUNNEL JUNCTION (MTJ) DEVICES WITH A SYNTHETIC ANTIFERROMAGNET (SAF) STRUCTURE INCLUDING A MAGNETIC SKYRMION

BACKGROUND

A magnetic tunneling junction (MTJ), typically comprising a fixed magnet (layer or structure) and a free magnet (layer or structure) separated by a tunneling barrier layer, can be switched between two states of electrical resistance: one state having a low resistance; and one state with a high resistance. This phenomenon is known as tunneling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (e.g., have non-parallel or antiparallel orientation). As such various magnetic random access memory (MRAM) devices employing a MTJ have been proposed and are under development. Spin-Transfer Torque Memory (STTM) devices are two terminal non-volatile magnetic memory devices that utilize a MTJ. Spin Orbit Torque (SOT) devices are three terminal non-volatile magnetic memory devices that likewise utilize a MTJ.

For some MTJ devices, current-induced magnetization switching may be used to set the bit states of a memory cell. Polarization states of one ferromagnetic layer can be switched relative to a fixed polarization of the second ferromagnetic layer (e.g., via the spin transfer torque phenomenon), enabling states of the MTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnet can be switched, for example by a pulse of current exceeding a certain critical value, while magnetization of the fixed magnet remains unchanged as long as the current pulse is below some higher threshold associated with the fixed magnet architecture.

The resistance state of a MTJ device may be defined by the relative orientation of magnetization of two magnetic layers (fixed and free) that are separated by a tunnel barrier. When the magnetization of the two magnetic layers have orientations that are in the same direction, the device is said to be in a low resistance state. Conversely, when the magnetization of the two magnetic layers have orientations that are in opposite directions, the device is said to be in a high resistance state. Resistance switching may be brought about by passing a critical amount of spin polarized current or switching current through the device so as to influence the orientation of the magnetization of the free magnet to align with the magnetization of the fixed magnet. By changing the direction of the current, the magnetization in the free magnet may be reversed relative to that of the fixed magnet. Since the free magnet does not need power to retain relative orientation of magnetization, the resistance state of the MTJ device may be retained even when there is no power applied to the device.

Synthetic antiferromagnetic (SAF) structures have been shown to be useful in MTJ devices, for example in countering a fringing magnetic field associated with the fixed magnet. SAF structures in practice however pose many manufacturing challenges because they may require the addition of a large number of material layers, further complicating a MTJ device stack. For example, some SAF structures may include ten, or more, material bi-layers, each having nanometer (nm) thickness constraints. Marginality in the deposition of any one of these layers may result in failure to form an actual SAF. Hence, the greater device stack complexity may increase cost and/or reduce device yield. SAF structures with lower complexity may therefore advantageously reduce device cost and/or increase device yield.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
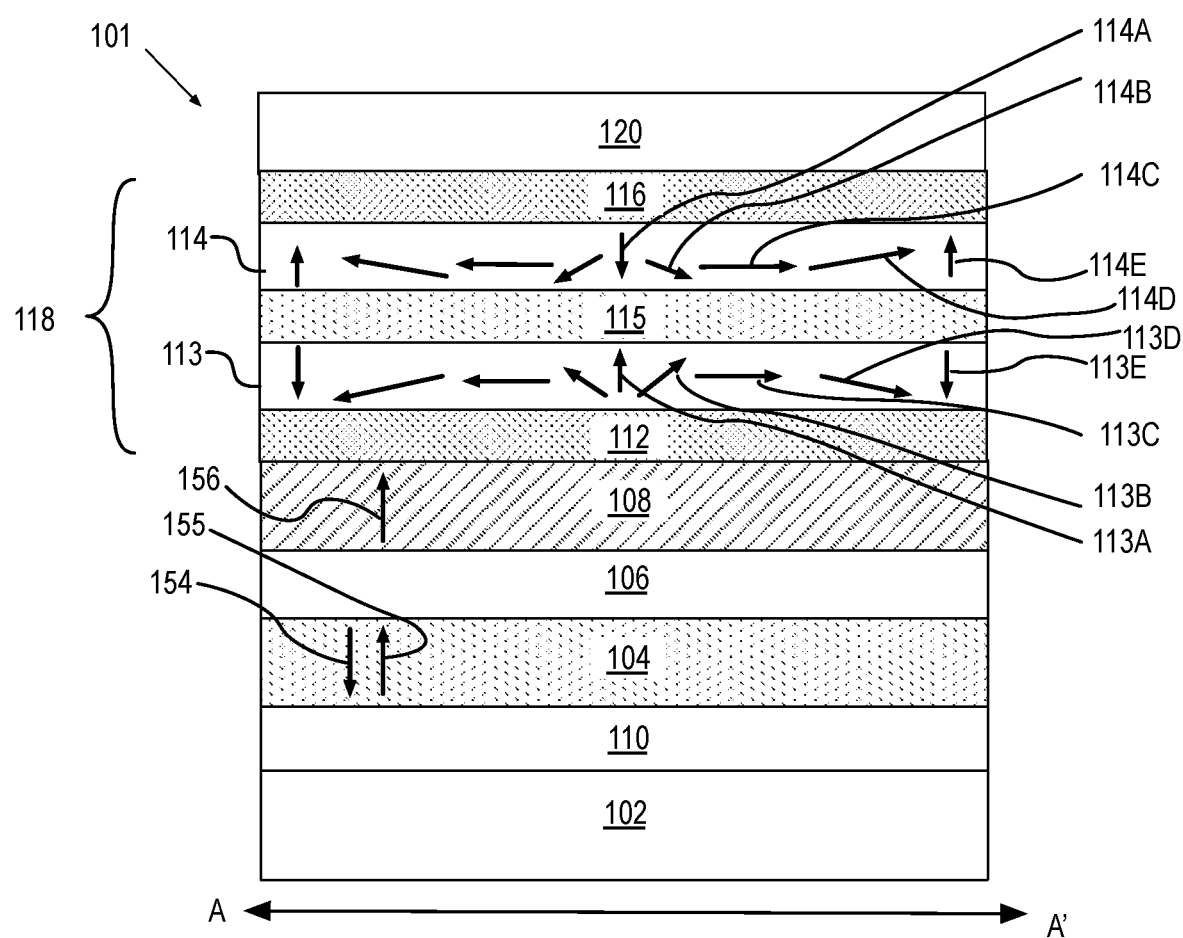
FIG. 1A illustrates a cross-sectional view of a STTM material layer stack with a SAF structure that includes a magnetic skyrmion, in accordance with some embodiments.

Magnetic tunneling junction (MTJ) devices (e.g., STT, SOT, etc.) with synthetic antiferromagnet (SAF) structures including magnetic skyrmions, and their methods of fabrication are described. In the following description, numerous specific details are set forth, such as exemplary device architectures and fabrication methods to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In some embodiments, a MTJ device may comprise a SAF structure, for example to reduce fringing magnetic field associated with the fixed magnet, and/or improve stability of the fixed magnet (e.g., reduce likelihood of unintentional flipping of magnetization within the fixed magnet). In embodiments described herein, the SAF structure includes a magnetic skyrmion texture, referred to herein as a "skyrmion SAF structure." In a magnetic skyrmion, remnant magnetization can maintain a stable domain spin topology (e.g., one that is neither uniquely in the plane of MTJ material layer(s), nor perpendicular to the plane of MTJ material layers). Within a magnetic skyrmion, the total magnetic exchange coupling includes an antisymmetric exchange term arising from interaction between neighboring spins. Although not bound by theory, it is currently understood that antisymmetric exchange may result from a strong spin orbit coupling between various material layers within a skyrmion SAF structure. The spin orbit coupling giving rise to the antisymmetric exchange interaction is known as the Dzyaloshinskii-Moriya interaction (DMI). The antisymmetric exchange coupling may induce neighboring electron spins to be canted at some finite angle from each other (on average). In some embodiments, a magnetic skyrmion within a SAF structure is of the Neel type, where the electron spin orientation is substantially perpendicular at a core or axis of the MTJ material stack, and gradually changes orientation with radial distance from the axis to a periphery, or edge, of the MTJ material stack. The spin orientation may again be perpendicular at the periphery, but antiparallel to the perpendicular spin orientation at the topologic core of the magnetic skyrmion. Such an arrangement can provide a large collection of electrons having stable spin orientation. In some other embodiments, a magnetic skyrmion within a SAF structure is of the Bloch type, where the electron spin orientation is substantially perpendicular at the topological core of the magnetic skyrmion, and again gradually changes orientation with increasing radial distance from the axis to a periphery, or edge, of the MTJ material stack. The spin orientations at the core and periphery may again be antiparallel, with the spin topology akin to a vortex. Such an arrangement may also provide a large collection of electrons having stable spin orientation.

With the stability of a magnetic skyrmion, a SAF structure including a magnetic skyrmion may need relatively few magnetic layers to achieve a suitably anti-ferromagnetic state. For example, a SAF structure may have only two magnetic material layers. A first of the magnetic material layers may comprise a magnetic skyrmion having a topology that is complementary to the topology of a magnetic skyrmion in a second of the magnetic materials. As such, a skyrmion SAF structure may be simplified, for example including only a coupling layer between two magnetic layers. A skyrmion SAF structure may also include additional layers, such as interface layers that may, for example, promote desired topologies of the magnetic skyrmions.

As described further below, a MTJ device may include at least first and second electrodes, a free magnet between the first and second electrodes, a fixed magnet between the first and second electrodes, a tunnel barrier between the free magnet and the fixed magnet, and a skyrmion SAF structure between the fixed magnet and one of the electrodes on a side of the fixed magnet that is opposite the free magnet. In some embodiments, a magnetic skyrmion within the SAF structure includes a magnetic material that is in contact with a layer of non-magnetic material. In some such embodiments, an interfacial Dzyaloshinskii-Moriya interaction (DMI) between the magnetic material and the non-magnetic material promote the desired spin topology within the magnetic material.

FIG. 1A illustrates a cross-sectional illustration of a pSTTM device 101. Although a pSTTM device is illustrated for the purpose of explanation, skyrmion SAF architectures, structures, and/or techniques described in the context of an exemplary pSTTM device may be applied to other MTJ devices, such as, but not limited to, SOT devices.

As depicted, pSTTM device 101 includes electrodes 102 and 120 and a pSTTM material stack between electrodes 102 and 120. In this example, a free magnet 104 and a fixed magnet 108 are between electrodes 102 and 120. The pSTTM material stack further includes a tunnel barrier 106 between free magnet 104 and fixed magnet 108. The pSTTM material stack further includes a skyrmion SAF structure 118 that is between free magnet 104 and electrode 120. Skyrmion SAF structure 118 is therefore on a side of fixed magnet 108 that is opposite free magnet 104. Skyrmion SAF structure 118 includes a magnetic layer 113 and a magnetic layer 114. A coupling layer 115 is between magnetic layers 113, 114. Skyrmion SAF structure 118 further includes an interface layer 112 between magnetic layer 113 and fixed magnet 108, and an interface layer 116 between magnetic layer 114 and electrode 120. One or more of interface layers 112, 116 may be absent from a Skyrmion SAF structure, for example where other material layers within the pSTTM material stack and/or electrode 120 provide suitable interfaces to magnetic layer 113, and/or magnetic layer 114, respectively. Hence, a Skyrmion SAF structure in accordance with embodiments herein may have fewer than the five material layers illustrated in pSTTM device 101. Notably, skyrmion SAF structure 118 is considerably less complex than many conventional SAF structures, which may have 10-20 material bi-layers, for example.

In some exemplary embodiments, magnetic layer 113 comprises a first magnetic skyrmion and magnetic layer 114 comprises a second magnetic skyrmion. Skyrmion SAF structure 118 advantageously has two skyrmions with inverted domain spin topologies. In the illustrative embodiment, coupling layer 115 is in contact with each of magnetic layers 113 and 114. Coupling layer 115 may be any non-magnetic material that has a suitable spin-orbit coupling effect. A spin orbit interaction at an interface between magnetic layer 113 the non-magnetic material of coupling layer 115 may promote a magnetic skyrmion in magnetic layer 113 that has a particular topology. Coupling layer 115 may have a spin-orbit coupling effect of a particular sign (e.g., "+", or "−") that promotes a particular spin canting within magnetic layer 113. The DMI at this interface may be a determinative factor in the spin topology within magnetic layer 113. Alternatively, the DMI at this interface may merely be a significant factor in the spin topology within magnetic layer 113, for example where the interface between magnetic layer 113 and interface material 112 is also a significant factor in determining the spin topology within magnetic layer 113. A spin orbit interaction at an interface between magnetic layer 114 and coupling layer 115 may likewise promote a magnetic skyrmion in magnetic layer 114 that has a particular spin topology.

Coupling layer 115 may have a spin-orbit coupling effect of a particular sign (e.g., "+" or "−") promoting a particular spin canting within magnetic layer 114 that favors a stable antiferromagnetism within skyrmion SAF structure 118. For example, with coupling layer 115 between the magnetic layers 113 and 114, coupling layer 115 may advantageously have a spin-orbit coupling effect of one sign (e.g., "+", or "−") on both magnetic layer 113 and magnetic layer 114 to promote magnetic skyrmions of opposite polarities within magnetic layers 113 and 114.

In FIG. 1A, the orientation of various statistically dominant local magnetization (spin) states 113A, 113B, 113C, 113D and 113E are illustrated over a diameter of magnetic layer 113. The states are representative of a Neel-type magnetic skyrmion spin texture topology where an average local magnetization depicted by the spin states varies monotonically between perpendicular and in-plane over a radius of magnetic layer 113. As shown, the magnetization state 113A at a core of the magnetic skyrmion in magnetic layer 113 is perpendicular to a plane of magnetic layer 113 and in a first direction (e.g., "up"). Magnetization or spin states 114A, 114B, 114C, 114D and 114E are likewise illustrated for magnetic layer 114. These states also vary monotonically between perpendicular and in-plane over a radius of magnetic layer 114. The spin state 114A at a core of the magnetic skyrmion in magnetic layer 114 is perpendicular to a plane of magnetic layer 114 (and perpendicular to a plane of magnetic layer 113), but in a direction antiparallel to the first direction (e.g., "down"). The two magnetic skyrmions in magnetic layers 113 and 114 therefore have opposite polarities. The spin states 113E and 114E at a periphery of the pSTTM material stack are likewise perpendicular and anti-parallel to each other. However, between the core and periphery, local magnetization states within magnetic layers 113 and 114 need not all be anti-parallel across coupling layer 115. For example, magnetization states 113C and 114C are substantially planar and parallel within an annular transition region of magnetic layers, 113 and 114.

Figure 1B:
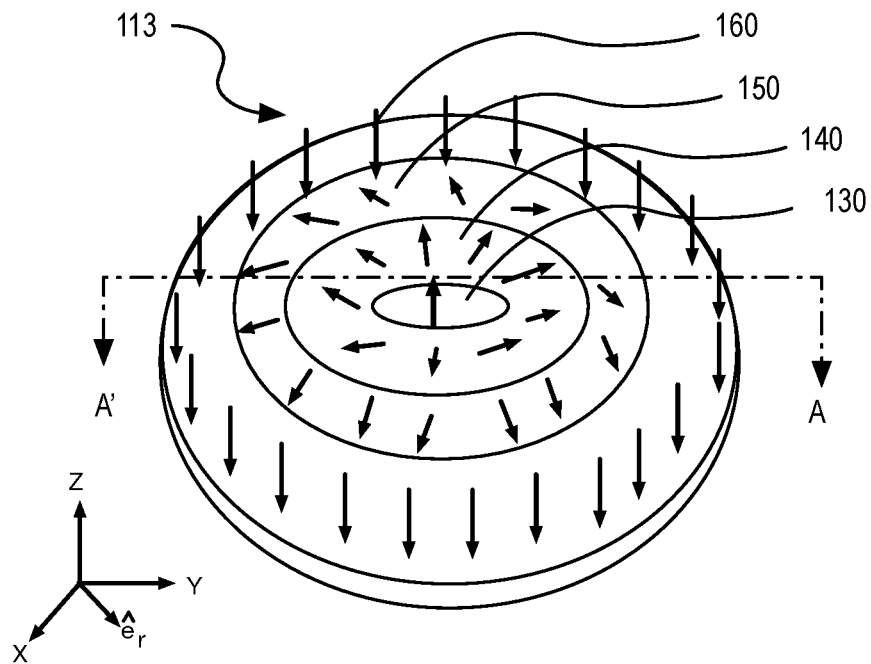
FIG. 1B illustrates an isometric view of a magnetic skyrmion of the Neel type that is within a first magnetic layer of a SAF structure, in accordance with some embodiments.
Figure 1C:
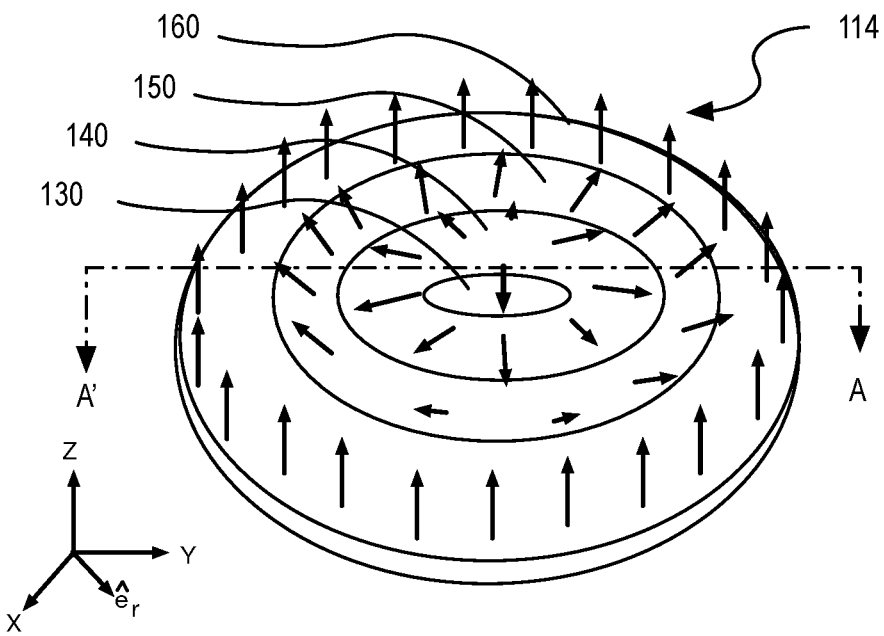
FIG. 1C illustrates an isometric view of a magnetic skyrmion of the Neel type that is within a second magnetic layer of a SAF structure, in accordance with some embodiments.

FIG. 1B and FIG. 1C are isometric views of magnetic layers 113 and 114, respectively. FIG. 1B and FIG. 1C further illustrate the Neel-type skyrmion that may be present in each of these layers. The A-A' line of the cross-sectional view shown in FIG. 1A is further illustrated in the context of FIGS. 1B and 1C. Within magnetic layer 113, an annular region 130 has perpendicular magnetic anisotropy of a first polarity while within magnetic layer 114, annular region 130 has perpendicular magnetic anisotropy of a opposite polarity. Within both magnetic layers 113 and 114, an annular region 140 having an in-plane magnetic anisotropy oriented radially away from the core surrounds annular region 130.

Within both magnetic layers 113 and 114, an annular region 150 beyond the annular region 140 has magnetic anisotropy canted in opposing directions between in-plane and perpendicular. The annular regions 160 surrounding annular regions 150 have perpendicular magnetic anisotropy that is antiparallel to annular regions 130 of the same layer.

Notably, the polarity of magnetic layers 113 and 114 may be opposite from that illustrated in FIGS. 1B and 1C, depending, for example, on the sign of the spin-orbit coupling effect of coupling layer 115 (FIG. 1A) and/or sign of the spin-orbit coupling effect of interface layers 112 and 116. For example, if coupling layer 115 has "+" signed DMI for magnetic layers 113 and 114, the core polarity may be as shown in FIGS. 1B and 1C while a "−" signed DMI may induce a core polarity in magnetic layers 113 and 114 that is opposite from that shown in FIGS. 1B and 1C.

In other embodiments, skyrmion SAF structure 118 (FIG. 1A) comprises Bloch-type skyrmions. Such a vortex topology may have one of four states: a first or second polarity, and a first or second chirality, or handedness (e.g., clockwise or counter-clockwise vortex). In some advantageous embodiments, skyrmion SAF structure 118 includes two Block-type skyrmions with opposing polarities. In some further embodiments, skyrmion SAF structure 118 includes two Block-type skyrmions having opposite polarity and opposite chirality. For such embodiments, an antiferromagnetic structure may be present at all local regions within skyrmion SAF structure 118 (FIG. 1A) so that a net field from SAF structure 118 on free magnet 104 is substantially zero.

Figure 1D:
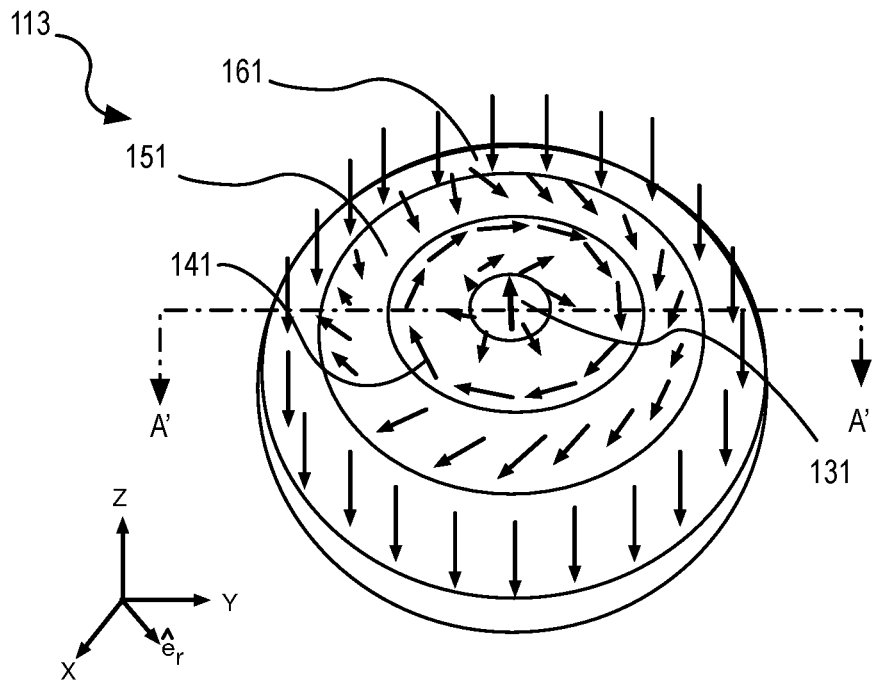
FIG. 1D illustrates an isometric view of a magnetic skyrmion of the Bloch type that is within a first magnetic layer of a SAF structure, in accordance with some embodiments.
Figure 1E:
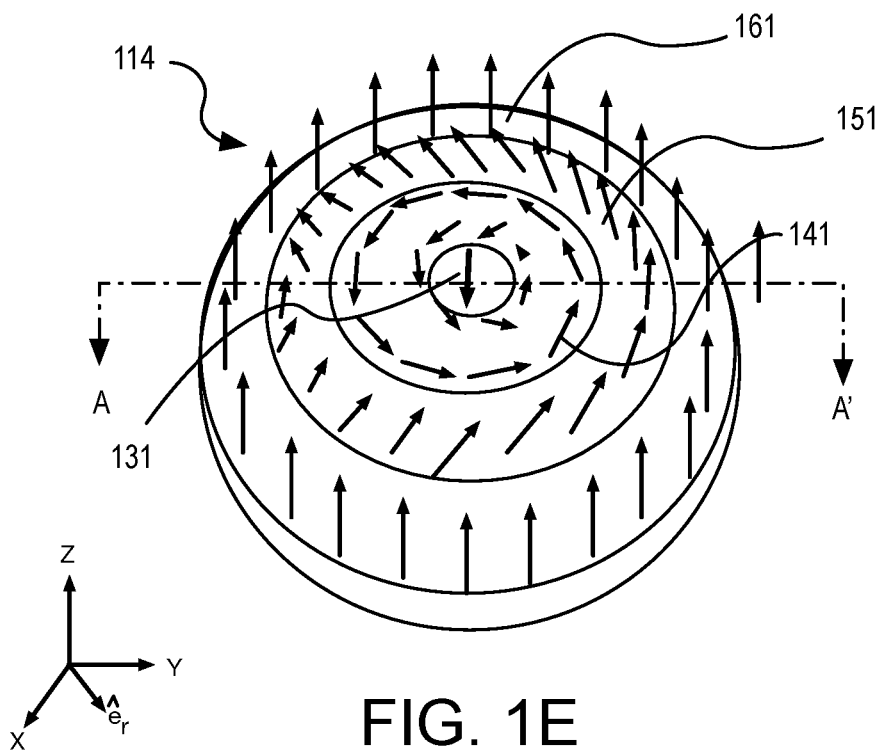
FIG. 1E illustrates an isometric view of a magnetic skyrmion of the Bloch type that is within a second magnetic layer of a SAF structure, in accordance with some embodiments.

FIGS. 1D and 1E illustrate isometric views of magnetic layers 113 and 114, each having a Bloch-type skyrmion. Arrows again represent an average local magnetization states that vary monotonically between perpendicular and in-plane over a cross section of the magnetic skyrmions. In this example, a core region 131 has a first perpendicular magnetic anisotropy within magnetic layer 113 and a second perpendicular magnetic anisotropy with magnetic layer 114 of opposite polarity. An annular region 141 having an in-plane magnetic anisotropy surrounds the core region 131. Within magnetic layer 113, annular region 141 has clockwise chirality. Within magnetic layer 114 annular region 141 has counter-clockwise chirality. Annular regions 151 beyond the annular regions 141 likewise have magnetic anisotropy that has chiral canting between in-plane and perpendicular. In the illustrative embodiment, the annular regions 161 surrounding annular regions 151 have perpendicular anisotropy antiparallel to the perpendicular magnetic anisotropy of core regions 131.

Notably, the polarity and chirality of magnetic skyrmions within magnetic layers 113 and 114 may be opposite that illustrated in FIG. 1D and FIG. 1E. The polarity and chirality may depend, for example, on the sign of the spin-orbit coupling effect of coupling layer 115 (FIG. 1A) and/or sign of the spin-orbit coupling effect of interface layers 112 and 116. For example, if coupling layer 115 has "+" signed DMI for magnetic layers 113 and 114, the polarity and chirality may be as shown in FIGS. 1D and 1E, while a "−" signed DMI may induce a polarity and chirality in magnetic layers 113 and 114 that is opposite from what is shown in FIG. 1D and FIG. 1E.

Magnetic layer 113 comprises a magnetic material that may have any composition known to be suitable for forming a magnetic skyrmion, such as, but not limited to, chiral lattice magnets. In some exemplary embodiments, magnetic layer 113 includes one or more of iron, cobalt, nickel or manganese. Magnetic layer 113 may be iron, an alloy of iron (e.g., predominantly iron), cobalt, an alloy of cobalt (e.g., predominantly cobalt), an alloy including both iron and cobalt, an alloy of nickel that may further include one or more iron and cobalt, or an alloy of manganese that may optionally further include one or more of iron, cobalt, or nickel. In some exemplary iron alloy embodiments, magnetic layer 113 includes iron and at least one of iridium, aluminum, silicon, or germanium. In some exemplary manganese embodiments, magnetic layer 113 includes manganese and silicon. Magnetic layer 113 may have a thickness in the range of 0.9 nm-4 nm, for example, and in some advantageous iron alloy embodiments magnetic layer 113 has a thickness less than 2 nm.

Magnetic layer 114 comprises a magnetic material that may likewise have any composition known to be suitable as magnetic material. In some exemplary embodiments, magnetic layer 114 includes one or more of iron, cobalt, nickel or manganese. Magnetic layer 114 may be iron, an alloy of iron (e.g., predominantly iron), cobalt, an alloy of cobalt (e.g., predominantly cobalt), an alloy including both iron and cobalt, an alloy of nickel that may further include one or more iron and cobalt, or an alloy of manganese, that may optionally further include one or more of iron, cobalt, or nickel. In some exemplary iron alloy embodiments, magnetic layer 114 includes iron and at least one of iridium, aluminum, silicon, or germanium. In some exemplary manganese embodiments, magnetic layer 114 includes manganese and silicon. In some advantageous embodiments, magnetic layer 114 has substantially the same composition as magnetic layer 113. Magnetic layer 114 may also have a thickness in the range of 0.9 nm-4 nm, for example, and in some advantageous iron alloy embodiments, magnetic layer 114 has a thickness less than 2 nm. In some embodiments where magnetic layer 114 has substantially the same thickness as magnetic layer 113, magnetic layer 114 also has substantially the same composition as magnetic layer 113.

In some embodiments, coupling layer 115 includes at least one of silicon, aluminum, platinum, iridium, tungsten, bismuth, gold, osmium, rhenium or lead. In some embodiments where magnetic layers 113 and 114 comprise predominantly Fe, coupling layer 115 comprises iridium (e.g., predominantly iridium). In some embodiments where magnetic layers 113 and 114 comprise predominantly Co, coupling layer 115 comprises platinum (e.g., predominantly platinum). In some further embodiments, where coupling layer 115 is predominantly Pt or Ir, one or more of aluminum, silicon or nickel may also be present in coupling layer 115. Depending on materials selected, coupling layer 115 may advantageously have a thickness between 0.9 nm-2 nm.

In some embodiments, a skyrmion SAF structure includes interface layers interfacing with a second side of the magnetic layers, opposite the intervening coupling layer. Such interface layers may advantageously comprise materials having a spin-orbit coupling effect that reinforces, or at least is compatible with, the spin orbit coupling effect of the coupling layer. For example, in further reference to FIG. 1A, interface layers 112 and 116 may both comprise materials having a "−" signed DMI for embodiments where coupling layer 115 has a "+" signed DMI for magnetic layers 113 and 114. Interface layers 112 and 116 may likewise both comprise materials having a "+" signed DMI for embodiments where coupling layer 115 has a "−" signed DMI for magnetic layers 113 and 114. As noted above, a skyrmion SAF structure may not require such interface layers, but their inclusion may promote the formation of a desired magnetic skyrmion topology within the magnetic layers. For example, with the interface materials on either side of magnetic layers 113 and 114 having synergistic DMI, repeatable magnetic skyrmion topologies may be provided irrespective of other factors, such as sidewall edge effects and defect effects within magnetic layers 113, 114, etc.

In some embodiments, interface layer 112 includes at least one of silicon, aluminum, platinum, iridium, tungsten, tantalum, bismuth, gold, osmium, rhenium or lead. In some embodiments where magnetic layer 113 comprises Fe, and coupling layer 115 comprises iridium, interface layer 112 comprises tungsten (e.g., predominantly tungsten). In some other embodiments where magnetic layer 113 comprises Fe, and coupling layer 115 comprises iridium, interface layer 112 comprises tantalum (e.g., predominantly tantalum). In some embodiments, where magnetic layer 113 comprises Co, and coupling layer 115 comprises platinum, interface layer 112 comprises tantalum (e.g., predominantly tantalum). In some other embodiments, where magnetic layer 113 comprises Co, and coupling layer 115 comprises platinum, interface layer 112 comprises tungsten (e.g., predominantly tungsten). Depending on the material(s) selected, interface layer 112 may advantageously have a thickness between 0.9 nm-4 nm.

In some embodiments, interface layer 116 includes at least one of silicon, aluminum, platinum, iridium, tungsten, tantalum, bismuth, gold, osmium, rhenium or lead. In some embodiments, interface layer 116 has substantially the same composition as interface layer 112. For example, where magnetic layers 113 and 114 comprise Fe, and coupling layer 115 comprises iridium, interface layer 112 and interface layer 116 both comprise tungsten (e.g., predominantly tungsten). In some other embodiments where magnetic layers 113 and 114 comprise Fe, and coupling layer 115 comprises iridium, interface layer 112 and interface layer 116 both comprise tantalum (e.g., predominantly tantalum). In some embodiments, where magnetic layers 113 and 114 both comprise Co, and coupling layer 115 comprises platinum, interface layer 112 and interface layer 116 both comprise tantalum (e.g., predominantly tantalum). In some other embodiments, where magnetic layers 113 and 114 both comprise Co, and coupling layer 115 comprises platinum, interface layer 112 and interface layer 116 both comprise platinum (e.g., predominantly platinum). Depending on the material(s) selected, interface layer 116 may advantageously have a thickness between 0.9 nm-4 nm. In some embodiments, interface layer 116 has substantially the same thickness as interface layer 112.

In embodiments represented by FIG. 1A, fixed magnet 108 and free magnet 104 have perpendicular magnetic anisotropy. As such, pSTTM device 101 is in a high resistance state when magnetization 154 of free magnet 104 is predominantly anti-parallel to a dominant magnetization 156 of fixed magnet 108. Conversely, pSTTM device 101 is in a low resistance state when a magnetization 155 in the free magnet 104 is predominantly parallel to magnetization 156 of fixed magnet 108. A change in resistance (high to low or low to high) in pSTTM device 101 results when a spin polarized electron current passing from the fixed magnet 108 through tunnel barrier 106 brings about a change in the direction of the magnetization in free magnet 104.

In an embodiment, fixed magnet 108 includes one or more material layer and has a thickness sufficient for maintaining a fixed magnetization. For example, fixed magnet 108 may include an alloy such as CoFe, FeB, or CoFeB. In some embodiments, fixed magnet 108 includes $Co_{100-x-y}Fe_xB_y$, where X and Y each represent atomic percentages. In some exemplary embodiments, X is in the range of 50-80, and Y is in the range of 10-40, and the sum of X and Y is less than 100. In one specific embodiment, X is 60 and Y is 20. In another embodiment, fixed magnet 108 is FeB, where the concentration of boron is between 10-40 atomic percent of the total composition of the FeB alloy. While the thickness of fixed magnet 108 may vary, in an embodiment where the fixed magnet 108 is a single layer of an Fe alloy (e.g., CoFeB, or FeB), fixed magnet 108 has a thickness that between 1 nm and 2.5 nm. Tunnel barrier 106 may comprise any material suitable for discriminating electron current base on electron spin. Tunnel barrier 106 (or spin filter layer) may also be referred to as a tunneling layer for electron current of a particular spin orientation. In an embodiment, tunnel barrier 106 includes a material such as, but not limited to, magnesium oxide (MgO) or aluminum oxide (e.g., $Al_2O_3$). In some embodiments, tunnel barrier 106 including an MgO material has an out-of-plane crystal orientation that is (001) and is lattice matched to free magnet 104 below the tunnel barrier 106 and lattice matched to fixed magnet 108 above tunnel barrier 106. In one example, the tunnel barrier 106 is MgO and has a thickness in the range of 1 nm to 2 nm.

Free magnet 104 includes one or more material layers. In some embodiments, free magnet 104 includes a magnetic material such as Co, Ni, Fe or alloys of these materials. In an embodiment, free magnet 104 includes a magnetic material such as FeB, CoFe or CoFeB. In some embodiments, free magnet 104 comprises $Co_{100-x-y}Fe_xB_y$, where X is in the range 50-80 and Y is in the range of 10-40, and the sum of X and Y is less than 100. In one exemplary embodiment, X is 60 and Y is 20. In another embodiment, free magnet 104 comprises FeB, where the concentration of boron is between 10-40 atomic percent of the total composition of the FeB alloy. The thickness of free magnet 104 may vary, however in some examples free magnet 104 has a thickness that is in the range of 1 nm-2.5 nm.

Spacer 110 includes one or more material layers. In some embodiments, spacer 110 includes a non-magnetic material. Spacer 110 may serve as an enhancement or template layer that improves crystallinity and/or crystal texture of free magnet 104, for example. In some embodiments, spacer 110 has an out-of-plane crystal orientation that is (001) and is lattice matched to free magnet 104. In some embodiments, spacer 110 comprises MGO. Spacer 110 may advantageously have a thickness less than tunnel barrier 106. In some embodiments, spacer 110 has a thickness less than 1.5 nm.

Electrode 102 may include one or more material layers. In some embodiments electrode 102 comprises an amorphous conductive layer. In some embodiments, electrode 102 includes predominantly one of W, Ta, TaN or TiN. In another embodiment, electrode 102 includes one or more Ru layers interleaved with one or more Ta layers. The thickness of electrode 102 may vary, but in some examples electrode 102 has a thickness in the range of 20 nm-50 nm. Electrode 120 may likewise include one or more material layers. In some embodiments, electrode 120 includes predominantly one of W, Ta, TaN or TiN. In some embodiments, electrode 102 and electrode 120 are the same metal (e.g., both Ta or TiN). The thickness of electrode 120 may also vary, however in some examples electrode 120 has a thickness that is in the range of 70-70 nm.

Figure 2:
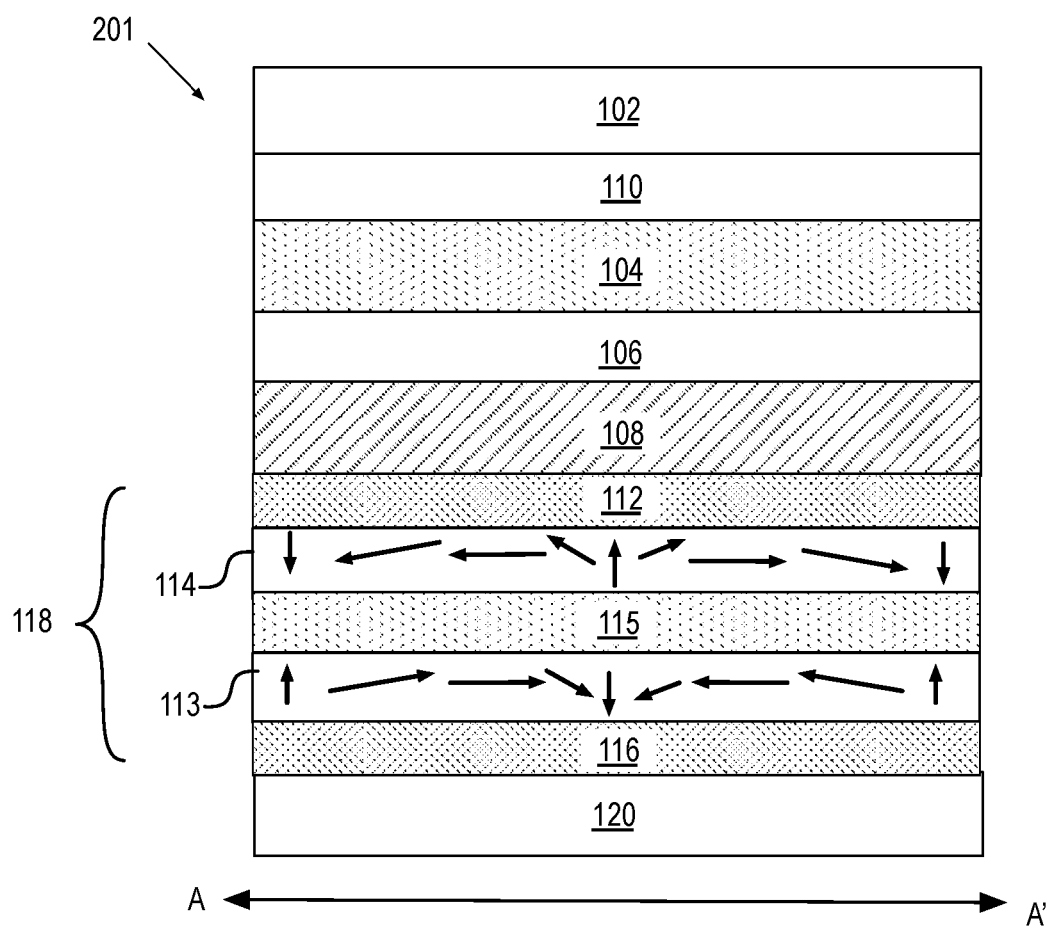
FIG. 2 illustrates a STTM material layer stack with a SAF structure that includes magnetic skyrmions, in accordance with some alternative embodiments.

Notably, a MTJ devices in accordance with embodiments herein may have layer architectures other than that illustrated for pSTTM device 101. For example, FIG. 2 illustrates cross-sectional view of a pSTTM device 201 including skyrmion SAF structure 118 located below fixed magnet 108 with pSTTM device 201 having a material layer structure that is essentially inverted from the layer structure of pSTTM device 101. Material layers illustrated in FIG. 2 having the same reference number as in FIG. 1A may have any or all of the properties described above in the context of FIG. 1A.

Figure 3:
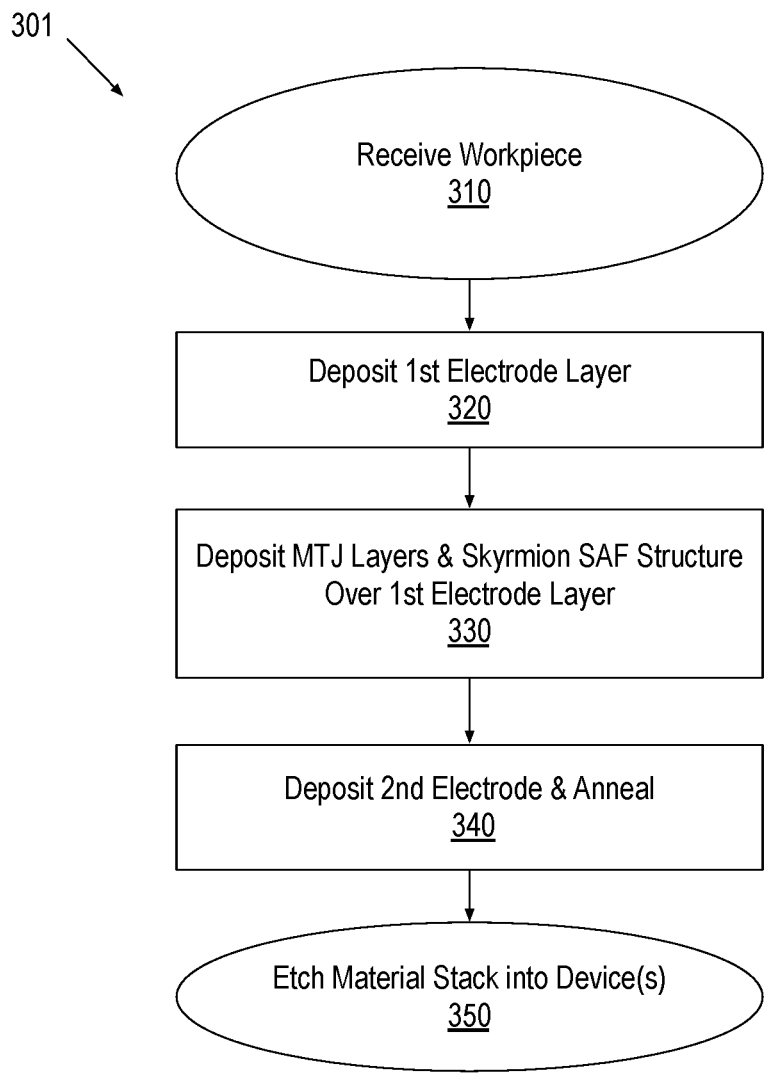
FIG. 3 is a flow diagram illustrating methods of manufacturing a STTM device, in accordance with some embodiments.

FIG. 3 is a flow diagram illustrating methods of manufacturing a MTJ device, in accordance with some embodiments. Methods 301 begin at block 310 where a workpiece is received. The workpiece may be any known to be suitable for semiconductor device manufacture, such as, but not limited to material wafers or panels. The workpiece received may include a conductive interconnect at least partially embedded within a dielectric layer. In some embodiments, the workpiece includes one or more CMOS circuits. In some such embodiments, the one or more CMOS circuits includes a access transistor coupled to one end of the conductive interconnect. Methods 301 continue at block 320 where a first electrode layer(s) is deposited. In some embodiments, at block 320 a first electrode layer is blanket deposited by a physical vapor deposition (PVD) process. In an embodiment, the PVD process is an RF or a DC sputtering process. Methods 301 continue at block 330 where any suitable MTJ layers (e.g., a fixed magnet, free magnet, tunnel barrier) are deposited along with a skyrmion SAF structure, for example having one or more of the structural features described above. In some embodiments, block 330 further comprises depositing a free magnet layer over the first electrode, depositing a tunnel barrier over the free magnet layer, depositing a fixed magnet layer over the tunnel barrier, and depositing a skyrmion SAF structure over the fixed magnet layer. In some other embodiments, block 330 further comprises depositing a skyrmion SAF structure over the first electrode layer, depositing a fixed magnet layer over the skyrmion SAF structure, depositing a tunnel barrier over the fixed magnet layer, and depositing a free magnet layer over the tunnel barrier. In both of these embodiments, depositing the skyrmion SAF structure may further comprise depositing a first magnetic layer comprising a first magnetic skyrmion having a first polarity, depositing a coupling layer over the first magnetic layer, and depositing, over the coupling layer, a second magnetic layer comprising a second magnetic skyrmion having a second polarity, opposite the first polarity.

Methods 301 continue with the deposition of any additional device material layers, such as, but not limited to a second electrode, which in the exemplary embodiment is deposited at block 340 according to any technique suitable for the material. A thermal anneal may also be performed at block 340 to achieve a desired crystallinity in one or more of the device material layers and/or achieve a desired remnant magnetization within one or more of the device material layers. Methods 301 complete at block 350 where the material stack deposited over the workpiece is patterned into one or more devices, for example with one or more etch processes. Any suitable backend processing may then be performed to couple one or more of the device electrodes into a memory circuit according to any techniques known in the art.

FIG. 4A-4D illustrate a cross-section view of a pSTTM device evolving as selected fabrication operations are performed, for example in accordance with one or more implementations of methods 301.

Figure 4A:
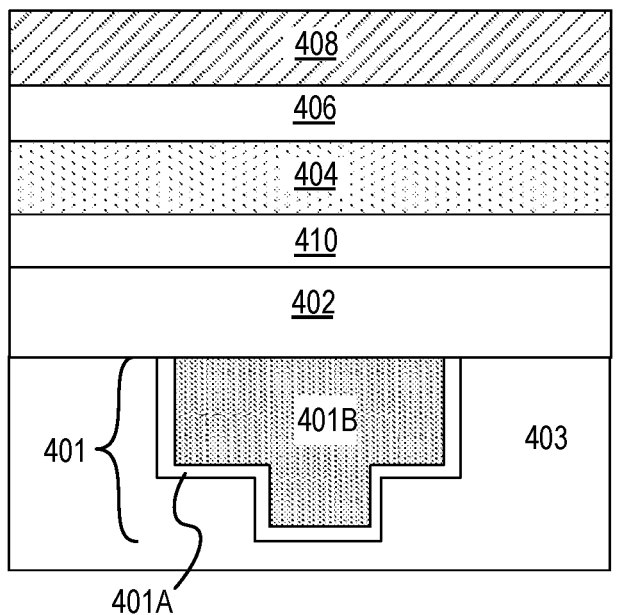
FIG. 4A illustrates a cross-sectional view following the formation of a first electrode on a conductive interconnect, and following the formation of a MTJ, in accordance with some embodiments.

FIG. 4A illustrates a cross-sectional view of a first electrode on a conductive interconnect, following the formation of a MTJ, in accordance with some embodiments. In FIG. 4A, a conductive interconnect 401 is surrounded by a dielectric layer 403 that is over or above a substrate (not depicted). In some embodiments, conductive interconnect 401 is electrically connected to a circuit element such as a transistor (not shown). Conductive interconnect 401 may be formed in dielectric layer 403 by any suitable damascene or a dual damascene process. In an embodiment, the conductive interconnect 401 is deposited using a physical vapor deposition process or a plasma enhanced chemical vapor deposition process. Conductive interconnect 401 may be first blanket deposited and subsequently planarized. In an embodiment, conductive interconnect 401 includes a barrier layer 401A, comprising predominantly tantalum or ruthenium, for example. A fill metal 401B, such as copper, tungsten or ruthenium is in contact with barrier layer 401A. In an embodiment, the dielectric layer 403 comprises silicon (e.g., silicon dioxide, silicon nitride, silicon carbide, or carbon doped silicon oxide). The dielectric layer 403 may have an uppermost surface that is substantially planar with an uppermost surface of the conductive interconnect 401, as illustrated. In some examples, the dielectric layer 403 has a total thickness between 70 nm-300 nm.

An electrode layer 402 is deposited over (e.g., on) conductive interconnect 401 and on adjacent dielectric layer 403. A non-magnetic spacer layer 410 is deposited over (e.g., on) electrode layer 402. A free magnetic layer 404 is deposited over (e.g., on) spacer layer 410. In an embodiment, the spacer layer 410 is deposited using a reactive sputter deposition technique that comprises exposing the workpiece to magnesium and oxygen. In some embodiments, the spacer layer 410 is deposited to a thickness between 0.3 nm-1.5 nm. In some embodiments, the spacer layer 410 includes an amorphous MgO. The amorphous MgO may have a lower dielectric strength compared to a dielectric strength of a tunnel barrier layer, for example. In some embodiments, free magnetic layer 404 is blanket deposited using a PVD process. In some embodiments where free magnetic layer 404 includes Co or an alloy of Co (e.g., CoB, CoFe or CoFeB and an alloy of iron such as FeB), the deposition process is carried out at room temperature. In some such embodiments, free magnetic layer 404 is formed by a co-sputter deposition process in a PVD chamber.

As further shown in FIG. 4A, a tunnel barrier layer 406 is blanket deposited over (e.g., on) free magnetic layer 404. In some embodiments where tunnel barrier layer 406 is a layer of crystalline MgO, free magnetic layer 404 is deposited using a reactive sputter process. In some such embodiments, the reactive sputter process is carried out at room temperature. In other such embodiments, the reactive sputter process is carried out at elevated temperatures (e.g., between 200-400 C). In some embodiments where tunnel barrier layer 406 is a layer of MgO, the MgO is RF sputtered from a MgO target. In some embodiments where tunnel barrier layer 406 includes magnesium and oxygen, tunnel barrier layer 406 is formed by a reactive oxidation of a DC-sputtered magnesium film. Subsequently, a fixed magnetic layer 408 is blanket deposited over (e.g., on) tunnel barrier layer 406. The deposition process employed to deposit fixed magnetic layer 408 may be substantially the same as the process utilized to deposit free magnetic layer 404, for example.

Figure 4B:
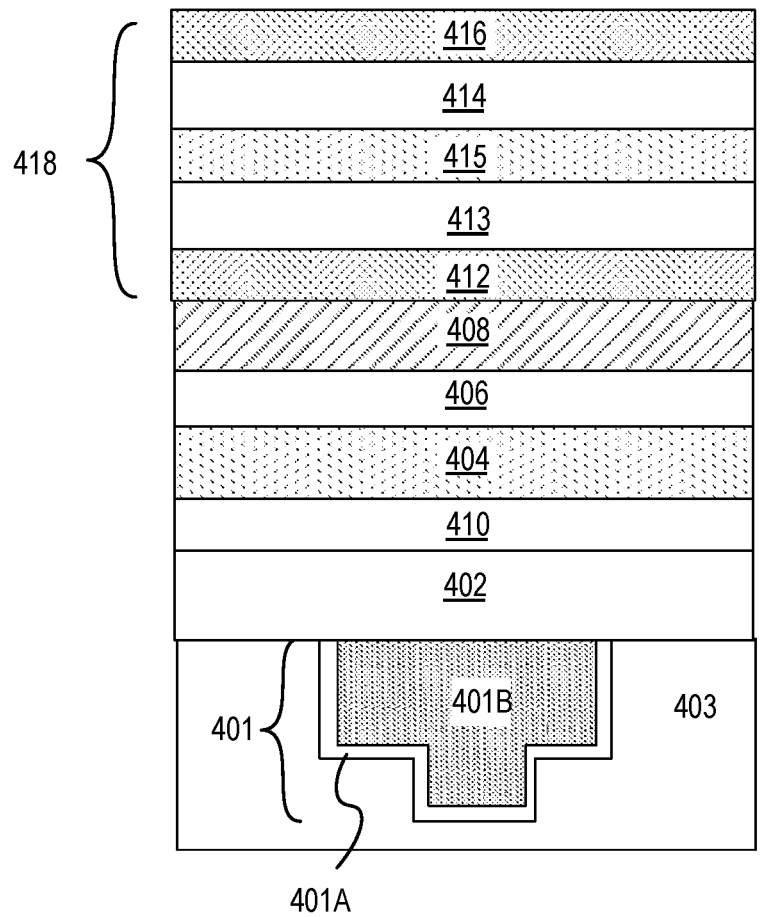
FIG. 4B illustrates a cross-sectional view of the structure in FIG. 4A following the further formation of a SAF structure including a magnetic skyrmion, in accordance with some embodiments.

FIG. 4B illustrates a cross-sectional view of the MTJ material structure in FIG. 4A following the further formation of skyrmion SAF material layers 418, in accordance with some embodiments. SAF material layers 418 include a magnetic material layer 413 deposited over fixed magnet layer 408. For embodiments where the first magnetic material layer 413 comprises an metal or alloy similar to that of the free magnet layer 404 and/or fixed magnet layer 408, a deposition process similar to that employed to deposit free magnet layer 404 and/or fixed magnet layer 408 may be employed to deposit magnetic material layer 413. In some embodiments, an interface material layer 412 is first deposited over (e.g., on) fixed magnet layer 408, and magnetic material layer 413 is then deposited over (e.g., on) interface material layer 412. A coupling material layer 415 is then deposited over (e.g., on) magnetic material layer 413, followed by the deposition of another magnetic material layer 414. In some embodiments, another interface material layer 416 is then deposited over (e.g., on) magnetic material layer 414 to complete SAF material layers 418.

Following deposition of the device material layers, an anneal may be performed under any conditions known to be suitable for promoting solid phase epitaxy of one or more material layers within the device material stack. For example, solid phase epitaxy may occur in free magnetic layer 404 following a template of a (nano)crystalline structure within tunnel barrier 406 and/or spacer 410. A thermal anneal of the material layer stack may, for example, be conducted in a furnace at a temperature between 300-400 C. In an embodiment, the anneal is performed post deposition, but prior patterning of the material layer stack into a device. During such an anneal one or more material layers may preferentially crystallize (e.g., tunnel barrier layer 406 and/or spacer layer 410) early in the anneal process and serve as a template later in the anneal process.

In some embodiments, the annealing process is performed with the workpiece in the presence of an external magnetic field that is to set the magnetization direction of one or more magnetic material layers. For example, the external magnetic field may set magnetization in fixed magnetic layer 408, in free magnetic layer 404. An external magnetic field that is directed parallel to a vertical axis of the material layer stack during the annealing process may promote PMA in fixed magnetic layer 408 and in free magnetic layer 404. An external magnetic field applied during the annealing process may also induce formation of skyrmions in magnetic material layers 413 and 415.

Figure 4C:
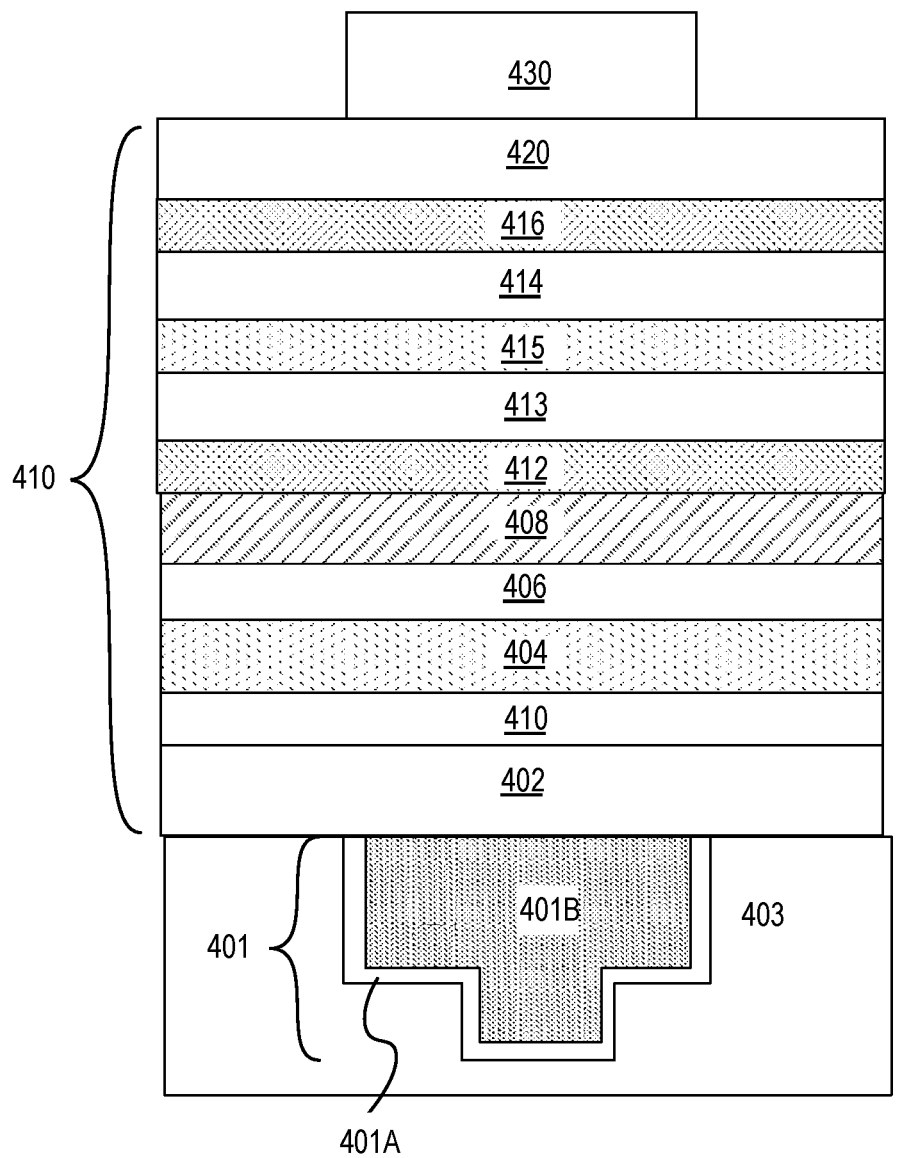
FIG. 4C illustrates a cross-sectional view of the structure in FIG. 3B following the formation of a top electrode and a STTM device mask; in accordance with some embodiments.
Figure 4D:
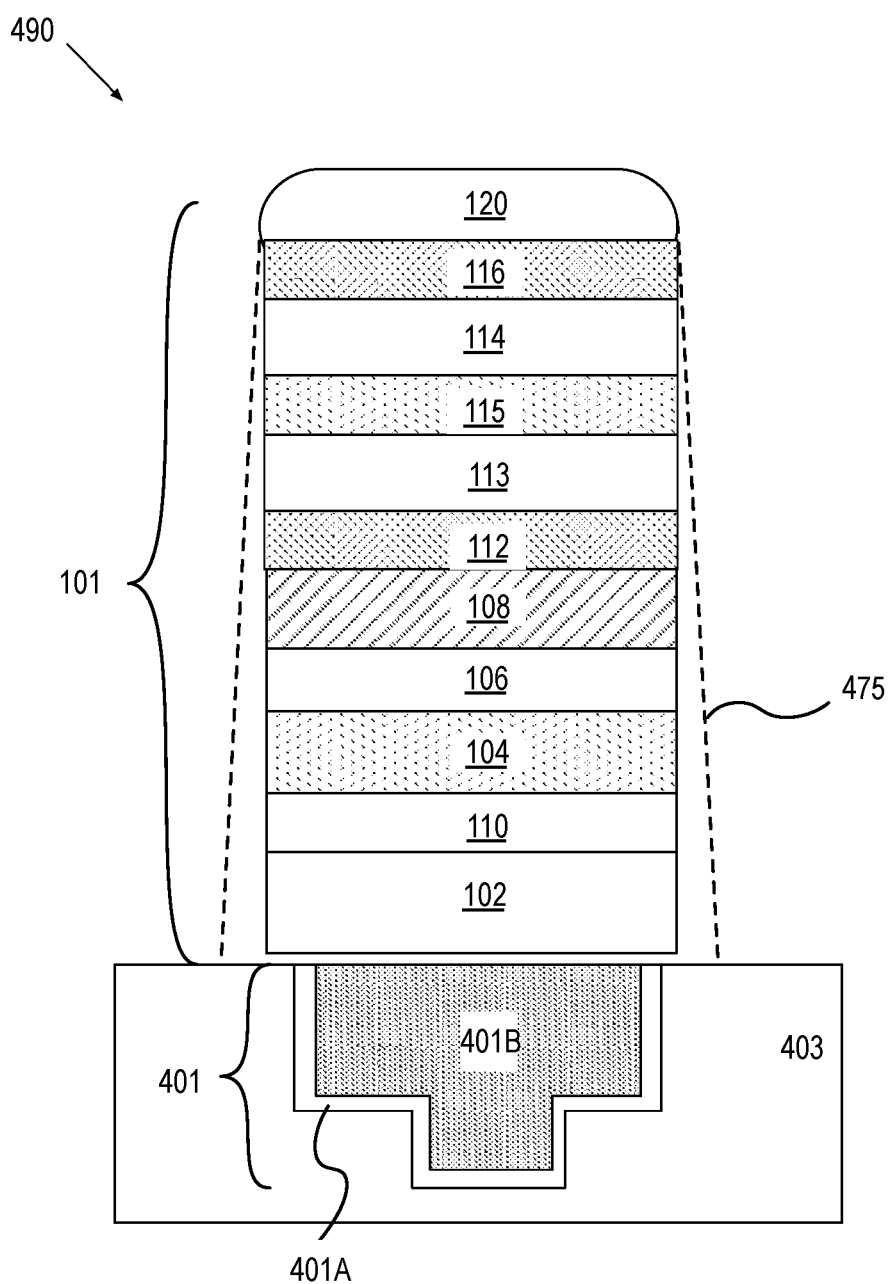
FIG. 4D illustrates a cross-sectional view of the structure in FIG. 4C following the a patterning of a STTM device; in accordance with some embodiments.

FIG. 4C illustrates the structure of FIG. 4B following the deposition of a top electrode material layer 420 and subsequent formation of a mask 430 on the material layer stack. In an embodiment, mask 430 includes a photosensitive resist. In some embodiments, mask 430 includes a dielectric material that is etched after forming a photosensitive resist on the dielectric material that is first lithographically patterned. Depending on embodiments, the width of mask 430 may vary with an exemplary feature diameter in the range of 10 nm-30 nm. FIG. 4D illustrates the structure of FIG. 4C following the patterning of the material layer stack to form a pSTTM device 490. pSTTM device 490 includes pSTTM device 101 having any or all of the features described above. In one embodiment, the material layer stack is etched by a plasma etch process, clearing each of the material layers 402-420 to arrive at pSTTM device 101 and expose the underlying dielectric layer 302. In the illustrative embodiment, the plasma etch process patterns electrode layer 420 to form an electrode 120, patterns the SAF material layers 116, 115, 114, 113 and 112 to form skyrmion SAF structure 118, patterns fixed magnetic layer 408 to form fixed magnet 108, patterns tunnel barrier layer 406 to form tunnel barrier 106, patterns free magnetic layer 404 to form free magnet 104, patterns coupling material layer 415 to form coupling layer 115, and patterns electrode layer 402 to form electrode 102. In some exemplary embodiments, the plasma etch process consumes mask 430, and may also consume 50-80% of electrode 120. Depending on the plasma etch parameters, pSTTM device 490 may have a sidewall angle that is tapered (indicated by dashed lines 475).

In some embodiments, a dielectric spacer (not depicted) is formed over, or adjacent to, a sidewall of pSTTM device 490. In some embodiments, a dielectric spacer layer is blanket deposited over pSTTM device 490, and on an uppermost surface of dielectric layer 403. In some such embodiments, the dielectric spacer layer is deposited without a vacuum break following the plasma etch process utilized to pattern the material layer stack into pSTTM device 490. In an embodiment, the dielectric spacer layer includes a material such as silicon nitride or carbon doped silicon nitride, and is advantageously substantially free of oxygen. The dielectric spacer layer may then be anisotropically pattern etched to form a dielectric spacer. In some further embodiments, an anneal process is performed after formation of pSTTM device 490 and after deposition of the dielectric spacer layer. In some such embodiments, the anneal process is conducted at an elevated temperature of at least 300° C. The anneal temperature may further be limited to less than 500° C. Such an anneal may promote crystallization at a sidewall of one or more material layers within pSTTM device 490 (e.g., tunnel barrier 406). Such an anneal may mitigate damage to one or more material layers within pSTTM 490 inflicted during manufacture (e.g., etching process utilized to form pSTTM device 490).

Figure 5:
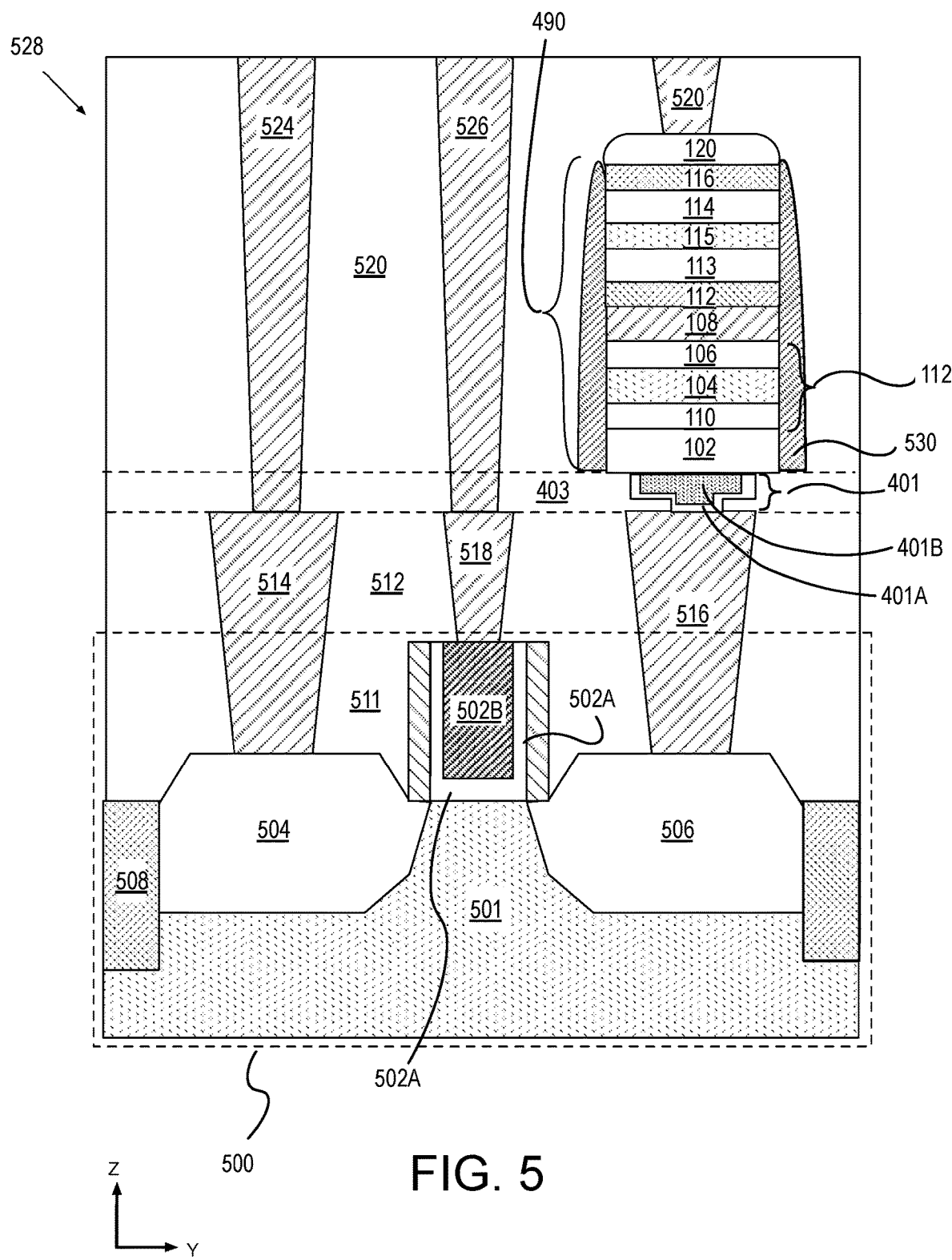
FIG. 5 illustrates a cross-sectional view of a STTM device on a conductive interconnect coupled to a transistor; in accordance with some embodiments.

FIG. 5 illustrates a MRAM cell 528 including pSTTM device 490 coupled to an access transistor 500. In an embodiment, pSTTM device 490 as described above in association with FIG. 4D (and FIG. 1A). In the illustrative embodiment, pSTTM device 490 is coupled to transistor 500 through conductive interconnect 401 and a drain contact 516. Drain contact 516 is coupled with a drain region 506 of access transistor 500. pSTTM device 490 includes electrode 102, electrode 120, free magnet 104 between electrodes 102 and 120, fixed magnet 108 between electrodes 102 and 120, tunnel barrier 106 between free magnet 104 and fixed magnet 108, a spacer layer 110 between free magnet 104 and electrode 102. pSTTM device 490 further includes a magnetic skyrmion SAF structure between fixed magnet 108 and electrode 120, and that further includes magnetic layers 113 and 114, coupled through coupling layer 115, for example substantially as described elsewhere herein. Skyrmion SAF structure further includes interface layers 112 and 116, for example substantially as described elsewhere herein. In an exemplary embodiment, pSTTM device 490 is surrounded by a dielectric spacer 530. In the illustrative embodiment, a memory contact 525 is coupled to the pSTTM device 490. In an embodiment, pSTTM device 490 has a width (along Y direction) that is greater than the width (along Y direction) of conductive interconnect 401. In one such embodiment, a portion of the electrode 102 is also on a dielectric layer 403. pSTTM device 490 may have a width smaller than the width of e conductive interconnect 401. In other examples, pSTTM device 490 has a width equal to width of conductive interconnect 401. In an embodiment, an underlying substrate 501 comprises manufactured integrated circuits. Substrate 501 may include a material such as single crystal silicon, polycrystalline silicon and silicon on insulator (SOI), as well as substrates formed of other semiconductor materials. Substrate 501 may also include semiconductor materials, metals, dielectrics, dopants, and other materials commonly found in semiconductor substrates.

In an embodiment, the access transistor 500 is a metal-oxide-semiconductor field-effect transistor (MOSFET). In some embodiments, access transistor 500 is a planar transistor or a nonplanar transistor. Nonplanar transistors include FinFET transistors such as double-gate transistors, tri-gate transistors, and wrap-around or "all-around gate" transistors (e.g., nanoribbon and nanowire transistors).

In an embodiment, access transistor 500 includes a gate stack including at least a gate dielectric layer 502A and a gate electrode 502B. Gate dielectric layer 502A may include one layer or a stack of layers. The one or more layers may include silicon oxide, silicon dioxide ($SiO_2$) and/or a high-k dielectric material (e.g., having a relative permittivity of at least 9). The high-k dielectric material may include one or more elements, such as hafnium, silicon, oxygen, titanium, tantalum, lanthanum, aluminum, zirconium, barium, strontium, yttrium, lead, scandium, niobium, and zinc. Exemplary high-k materials that may be used in the gate dielectric layer may further include oxygen with resulting compounds including, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Gate electrode 502B is over (e.g., on) the gate dielectric layer 502A and may consist of at least one P-type workfunction metal or N-type workfunction metal, depending on whether the transistor is to be a PMOS or an NMOS transistor. In some implementations, gate electrode 502B may comprise of a stack of two or more metal layers, where one or more metal layers are workfunction metal layers and at least one metal layer is a conductive fill layer. For a PMOS transistor, metals that may be used for gate electrode 502B include, but are not limited to, ruthenium, palladium, platinum, cobalt, nickel, and conductive metal oxides, e.g., ruthenium oxide. A P-type metal layer can serve as a PMOS gate electrode with a workfunction that is between about 4.9 eV and about 5.2 eV, for example. For an NMOS transistor, exemplary metals include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer can serve as an NMOS gate electrode with a workfunction that is between about 3.9 eV and about 4.2 eV, for example.

A source region 504 and drain region 506 may comprise impurity dopants such as boron, aluminum, antimony, phosphorous, or arsenic, for example. An annealing process may electrically activate these dopants. An epitaxial deposition process may also be performed to fabricate source region 504 and drain region 506. In some implementations, source region 504 and drain region 506 may comprise a silicon alloy such as silicon germanium or silicon carbide. In further embodiments, source region 504 and drain region 506 may comprise one or more alternate semiconductor materials such as germanium or a group III-V material. In the illustrative embodiment, an isolation dielectric 508 is adjacent to source region 504, drain region 506 and over portions of the substrate 501.

A source contact 514 and a drain contact 516 extend at least partially through a dielectric layer 511 and into a dielectric layer 512 above gate electrode 502B. In the illustrative embodiment, a source metallization structure 524 is coupled with source contact 514 and a gate metallization structure 526 is coupled with gate contact 518. In the illustrated embodiment, a dielectric layer 512 is adjacent to gate contact 518, drain contact 516, source contact 514, and portions of source metallization structure 524 and/or gate metallization structure 526.

In some embodiments, source contact 514, the drain contact 516 and gate contact 518 each includes a multi-layer stack. In some such embodiments, the multi-layer stack includes two or more distinct layers of metal such as a layer of Ti, Ru or Al and a conductive cap on the layer of metal. The conductive cap may include a material such as W or Cu. Metallization structures 524 and 526 and memory contact 520 may include a structure and materials that are substantially the same as the structure and materials of the conductive interconnect 401, for example as described elsewhere herein. A dielectric layer 520 is adjacent to the dielectric spacer 530, and a portion of electrode 120. Dielectric layer 520 is also adjacent to portions of the source metallization structure 524, gate metallization structure 526, and memory contact 525. Isolation dielectric 508, dielectric layers 512, 511, 403 and 520 may include any material that has sufficient dielectric strength to provide electrical isolation such as, but not limited to, silicon dioxide, silicon nitride, silicon oxynitride, carbon doped nitride, or carbon doped oxide.

Figure 6:
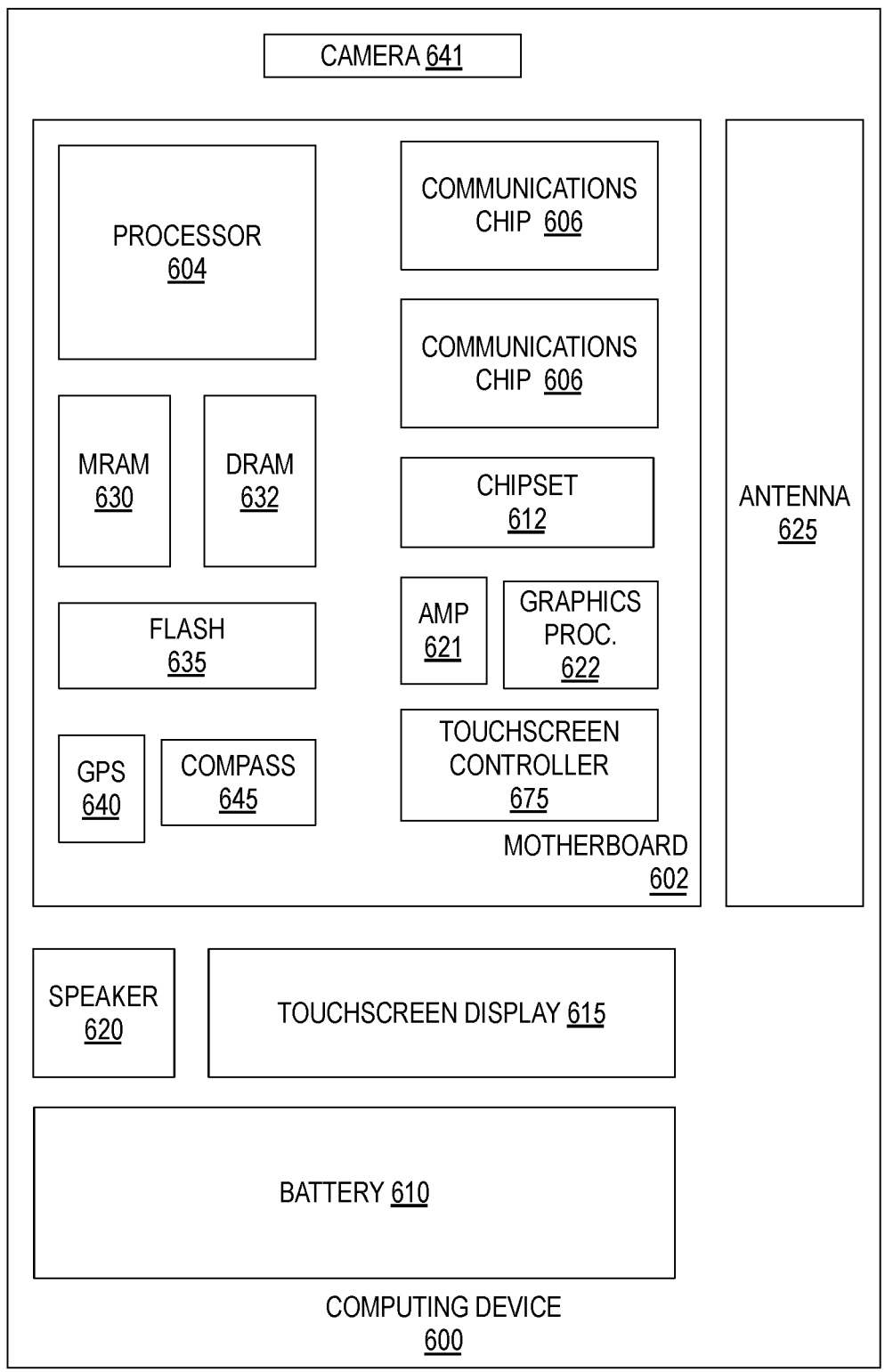
FIG. 6 illustrates a computing device, in accordance with some embodiments.

FIG. 6 illustrates a computing device 600 in accordance with embodiments of the present disclosure. In various implementations, computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

As shown, computing device 600 houses a motherboard 602. Motherboard 602 may include a number of components, including but not limited to a processor 604 and at least one communication chip 606. Processor 604 is physically and electrically coupled to the motherboard 602. In some implementations, communication chip 606 is also physically and electrically coupled to motherboard 602. In further implementations, communication chip 606 is part of processor 604.

Depending on its applications, computing device 600 may include other components that may or may not be physically and electrically coupled to motherboard 602. These other components include, but are not limited to, volatile memory (e.g., DRAM 632), non-volatile memory (e.g., MRAM 630), or flash memory 635. In some embodiments, MRAM 630 includes transistor 500 (FIG. 5) coupled with one at least one pSTTM memory device such as a pSTTM memory device 101 (FIG. 1A), pSTTM device 490 (FIG. 4D and FIG. 5), for example as described elsewhere herein. Computing device 600 may further include one or more of a graphics processor 622, a digital signal processor, a crypto processor, a chipset 612, an antenna 625, a display 615, a battery 610, an audio codec, a video codec, a power amplifier 621, a touchscreen controller 675, a global positioning system (GPS) device 640, a compass 645, an accelerometer, a gyroscope, a speaker 620, a camera 641, and a mass storage device (such as hard disk drive, compact disk (CD), digital versatile disk (DVD), or the like.

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of the computing device 600 includes an integrated circuit die packaged within processor 604. In some embodiments, the integrated circuit die of processor 604 or packaged processor includes embedded memory further including a transistor 500 coupled with one at least one pSTTM memory device such as a pSTTM memory device 101, pSTTM device 690, for example as described elsewhere herein. The term "processor" may refer to any device or portion of a device that processes electronic data from registers and/or memory to transform that electronic data into other electronic data that may be stored in registers and/or memory. Communication chip 606 may also include an integrated circuit die that includes embedded memory further including a memory array with memory cells including an MTJ device (e.g., pSTTM device 101 and/or pSTTM device 490).

Figure 7:
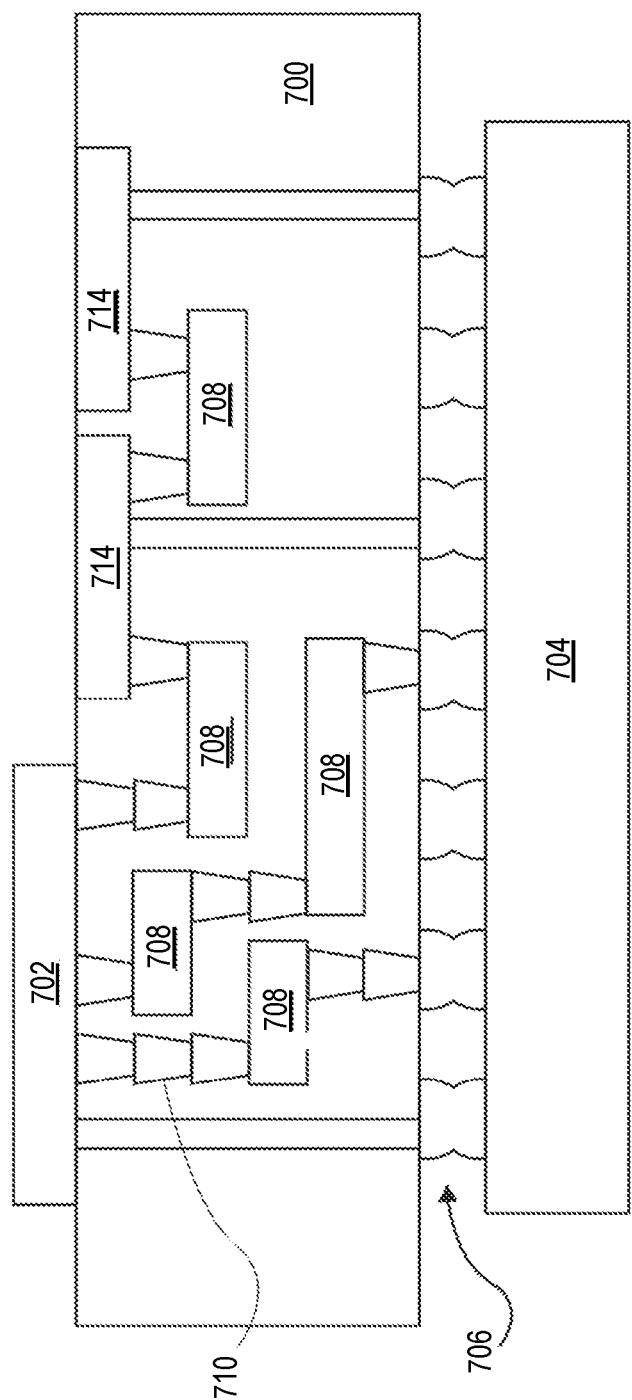
FIG. 7 illustrates an integrated circuit structure that includes one or more embodiments of an STTM device with a skyrmion SAF structure.

FIG. 7 illustrates an integrated circuit structure 700 that includes one or more exemplary embodiments. The integrated circuit (IC) structure 700 is an intervening structure used to bridge a first substrate 702 to a second substrate 704. The first substrate 702 may be, for instance, an integrated circuit die. The second substrate 704 may be, for instance, a memory module, a computer mother, or another integrated circuit die. The integrated circuit die may include one or more device systems such as a device structure including a transistor 500 coupled with a with one at least one pSTTM memory device such as a pSTTM device 101, or pSTTM device 490, for example.

Generally, integrated circuit (IC) structure 700 is to spread electrical connections to a wider pitch than that on substrate 702, and/or to reroute a connection to a different connection. For example, IC structure 700 may couple an integrated circuit die to a ball grid array (BGA) 706 that can subsequently be coupled to the second substrate 704. In some embodiments, the first and second substrates 702/704 are attached to opposing sides of IC structure 700. In other embodiments, the first and second substrates 702/704 are attached to the same side of IC structure 700. And in further embodiments, three or more substrates are interconnected by way of IC structure 700.

IC structure 700 may be formed of an epoxy resin, a fiberglass-reinforced epoxy resin, a ceramic material, or a polymer material such as polyimide. In further implementations, IC structure 700 may be formed of alternate rigid or flexible materials that may include the same materials described above for use in a semiconductor substrate, such as silicon, germanium, or other group III-N, group III-V and group IV materials. IC structure 700 may include metal interconnects 708 and via 710, including but not limited to through-silicon vias (TSVs) 710. IC structure 700 may further include embedded devices 714, including both passive and active devices. Such devices include, but are not limited to, capacitors, decoupling capacitors, resistors, inductors, fuses, diodes, transformers, a transistor 500 coupled with a with one at least one pSTTM memory device such as a pSTTM memory device 101, or pSTTM device 390, for example. More complex devices such as radio-frequency (RF) devices, power amplifiers, power management devices, antennas, arrays, sensors, and MEMS devices may also be formed on IC structure 700.

As used in any embodiment described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. While specific embodiments are described herein with respect to pSTTM devices. It is to be appreciated that embodiments described herein may also be applicable to other non-magnetic random access memory (MRAM) devices, such as, but not limited to, in plane or perpendicular spin orbit torque (SOT) memory devices. Hence, various modifications of the implementations described herein, as well as other implementations, which are apparent to persons skilled in the art to which the present disclosure pertains are deemed to lie within the spirit and scope of the present disclosure.

In first examples, s memory device, comprises a first electrode, a second electrode, a free magnet between the first electrode and the second electrode, a fixed magnet between the first electrode and the second electrode, a tunnel barrier between the free magnet and the fixed magnet, and a synthetic antiferromagnetic (SAF) structure between the fixed magnet and the second electrode. The SAF structure comprises a magnetic skyrmion.

In second examples, for any of the first examples the SAF structure comprises a first magnetic layer comprising a first magnetic skyrmion having a first polarity, a second magnetic layer comprising a second magnetic skyrmion having a second polarity, opposite the first polarity, and a coupling layer between the first and second magnetic layers.

In third examples for any of the first through second examples, an average magnetic anisotropy of the first and second magnetic skyrmions varies monotonically between perpendicular and in-plane over a radius of the SAF structure.

In fourth examples, for any of the first through this examples the average magnetic anisotropy of the first magnetic skyrmion is substantially antiparallel to the average magnetic anisotropy of the second magnetic skyrmion over the radius of the SAF structure.

In fifth examples, for any of the first through the fourth examples a core of the first and second magnetic skyrmions has perpendicular magnetic anisotropy, and a first annular region that surrounds the core region has in-plane magnetic anisotropy.

In sixth examples, for any of the fifth examples, a second annular region of the first and second magnetic skyrmions further surrounds the first annular region, and the second annular region has perpendicular anisotropy antiparallel to the core.

In seventh examples, for any of the sixth examples the first magnetic skyrmion has a magnetic chirality opposite that of the second magnetic skyrmion.

In eighth examples, for any of the second examples the first magnetic layer has substantially the same composition as the second magnetic layer. The first magnetic layer is between the coupling layer and a first interface layer, wherein the coupling layer has a spin-orbit coupling effect of a first sign on the first and second magnetic layers, and the first interface layer comprises a material having a spin-orbit coupling effect of a second sign, opposite the first sign, on the first magnetic layer. The second magnetic layer is between the coupling layer and a second interface layer, and the second interface layer comprises a material having a spin-orbit coupling effect of the second sign on the second magnetic layer.

In ninth examples, for any of the second examples the first and second magnetic layers comprise cobalt, iron or an alloy of cobalt and iron.

In tenth examples, for any of the ninth examples the coupling layer, the first interface layer, and the second interface layer each comprises at least one of nickel, silicon, aluminum, platinum, iridium, tungsten, tantalum, bismuth, gold, osmium, rhenium or lead.

In eleventh examples, for any of the tenth examples the first and second magnetic layers comprise iron, and the coupling layer comprises at least one of iridium, aluminum, silicon or nickel.

In twelfth examples, for any of the tenth examples each of the first and second magnetic layers is an alloy comprising iron and at least one of iridium, aluminum, silicon or nickel, an alloy comprising cobalt and iron, or an alloy comprising cobalt and nickel.

In thirteenth examples, for any of the tenth examples the first and second magnetic layers comprise cobalt and the coupling layer comprises platinum, or the first and second magnetic layers comprise Fe and the coupling layer comprises iridium.

In fourteenth examples, for any of the second examples the first and second magnetic layer each has a thickness between 2 nm-3 nm, the coupling layer has a thickness less than 2 nm, the free magnet and the fixed magnet comprise cobalt, boron and iron, and the tunnel barrier comprises magnesium and oxygen.

In fifteenth examples, an apparatus comprises a transistor above a substrate. The transistor comprises a gate, a source and a drain, and a non-volatile memory device above the transistor. The non-volatile memory device comprises a first electrode, a second electrode, a free magnet between the first electrode and the second electrode, a fixed magnet between the first electrode and the second electrode, a tunnel barrier between the free magnet and the fixed magnet, and a synthetic antiferromagnetic (SAF) structure between the fixed magnet and the second electrode. The SAF structure comprises a first magnetic layer comprising a first magnetic skyrmion having a first polarity, a second magnetic layer comprising a second magnetic skyrmion having a second polarity, opposite the first polarity, and a coupling layer between the first and second magnetic layers.

In sixteenth examples, for any of the fifteenth examples the apparatus comprises a first interface layer separated from the coupling layer by the first magnetic layer. The first interface layer comprises a material having a spin-orbit coupling effect on the first magnetic layer that is of opposite sign to a spin-orbit coupling effect associated with the interface layer. The apparatus comprises a second interface layer separated from the coupling layer by the second magnetic layer. The second interface layer comprises a material having a spin-orbit coupling effect that is of opposite sign to a spin-orbit coupling effect associated with the interface layer.

In seventeenth examples, for any of the sixteenth examples the first magnetic skyrmion has a first magnetic chirality and the second magnetic skyrmion has a second magnetic chirality, opposite the first.

In eighteenth examples, for any of the fifteenth examples the first magnetic skyrmion has a core with perpendicular anisotropy. The second magnetic skyrmion has a core with perpendicular magnetic anisotropy that is antiparallel to the perpendicular anisotropy of the first magnetic skyrmion.

In nineteenth examples, a method of fabricating a memory device comprises forming a material layer stack over a first electrode. The forming comprises depositing a free magnet layer above the first electrode, depositing a tunnel barrier layer over the free magnet layer, depositing a fixed magnet layer over the tunnel barrier layer, depositing a synthetic antiferromagnetic (SAF) structure over the fixed magnet layer, wherein the SAF structure comprises a magnetic skyrmion, forming a second electrode layer over the SAF structure, and etching the material layer stack.

In twentieth examples, for any of the nineteenth examples depositing the SAF structure further comprises depositing, over the fixed magnet layer, a first magnetic layer comprising a first magnetic skyrmion having a first polarity. Depositing the SAF structure further comprises depositing a coupling layer over the first magnetic layer, and depositing a second magnetic layer over the coupling layer, the second magnetic layer comprising a second magnetic skyrmion having a second polarity, opposite the first polarity.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A two-terminal magnetic memory device, comprising:
   a first electrode;
   a second electrode;
   a free magnet between the first electrode and the second electrode;
   a fixed magnet between the first electrode and the second electrode;
   a tunnel barrier between the free magnet and the fixed magnet; and
   a synthetic antiferromagnetic (SAF) structure between the fixed magnet and the second electrode, wherein the SAF structure comprises a magnetic skyrmion.

2. The memory device of claim 1, wherein the SAF structure comprises:
   a first magnetic layer comprising a first magnetic skyrmion having a first polarity;

a second magnetic layer comprising a second magnetic skyrmion having a second polarity, opposite the first polarity; and a coupling layer between the first and second magnetic layers.

3. The memory device of claim 2, wherein an average magnetic anisotropy of the first and second magnetic skyrmions varies monotonically between perpendicular and in-plane over a radius of the SAF structure.

4. The memory device of claim 3, wherein, over the radius of the SAF structure, the average magnetic anisotropy of the first magnetic skyrmion is substantially antiparallel to the average magnetic anisotropy of the second magnetic skyrmion.

5. The memory device of claim 3, wherein a core of the first and second magnetic skyrmions has perpendicular magnetic anisotropy, and a first annular region that surrounds the core region has in-plane magnetic anisotropy.

6. The memory device of claim 5, wherein a second annular region of the first and second magnetic skyrmions further surrounds the first annular region, the second annular region having perpendicular anisotropy antiparallel to the core.

7. The memory device of claim 6, wherein the first magnetic skyrmion has a magnetic chirality opposite that of the second magnetic skyrmion.

8. The memory device of claim 2, wherein:
the first magnetic layer has substantially the same composition as the second magnetic layer;
the first magnetic layer is between the coupling layer and a first interface layer, wherein the coupling layer has a spin-orbit coupling effect of a first sign on the first and second magnetic layers, and the first interface layer comprises a material having a spin-orbit coupling effect of a second sign, opposite the first sign, on the first magnetic layer; and
the second magnetic layer is between the coupling layer and a second interface layer, and wherein the second interface layer comprises a material having a spin-orbit coupling effect of the second sign on the second magnetic layer.

9. The memory device of claim 2, wherein the first and second magnetic layers comprise cobalt, iron or an alloy of cobalt and iron.

10. The memory device of claim 9, wherein the coupling layer, the first interface layer, and the second interface layer each comprises at least one of nickel, silicon, aluminum, platinum, iridium, tungsten, tantalum, bismuth, gold, osmium, rhenium or lead.

11. The memory device of claim 10, wherein the first and second magnetic layers comprise iron, and the coupling layer comprises at least one of iridium, aluminum, silicon or nickel.

12. The memory device of claim 11, wherein each of the first and second magnetic layers is an alloy comprising iron and at least one of iridium, aluminum, silicon or nickel, an alloy comprising cobalt and iron, or an alloy comprising cobalt and nickel.

13. The memory device of claim 10, wherein the first and second magnetic layers comprise cobalt and the coupling layer comprises platinum, or the first and second magnetic layers comprise Fe and the coupling layer comprises iridium.

14. The memory device of claim 2, wherein:
the first and second magnetic layer each has a thickness between 2 nm-3 nm;
the coupling layer has a thickness less than 2 nm;
the free magnet and the fixed magnet comprise cobalt, boron and iron; and
the tunnel barrier comprises magnesium and oxygen.

15. An apparatus comprising:
a transistor above a substrate, the transistor comprising:
a gate;
a source and a drain; and
a non-volatile two-terminal magnetic memory device above the transistor, the non-volatile two-terminal magnetic memory device comprising:
a first electrode;
a second electrode;
a free magnet between the first electrode and the second electrode;
a fixed magnet between the first electrode and the second electrode;
a tunnel barrier between the free magnet and the fixed magnet; and
a synthetic antiferromagnetic (SAF) structure between the fixed magnet and the second electrode, wherein the SAF structure comprises:
a first magnetic layer comprising a first magnetic skyrmion having a first polarity;
a second magnetic layer comprising a second magnetic skyrmion having a second polarity, opposite the first polarity; and
a coupling layer between the first and second magnetic layers.

16. The apparatus of claim 15, further comprising:
a first interface layer separated from the coupling layer by the first magnetic layer, wherein the first interface layer comprises a material having a spin-orbit coupling effect on the first magnetic layer that is of opposite sign to a spin-orbit coupling effect associated with the interface layer; and
a second interface layer separated from the coupling layer by the second magnetic layer, wherein the second interface layer comprises a material having a spin-orbit coupling effect that is of opposite sign to a spin-orbit coupling effect associated with the interface layer.

17. The apparatus of claim 15, wherein the first magnetic skyrmion has a first magnetic chirality and the second magnetic skyrmion has a second magnetic chirality, opposite the first.

18. The apparatus of claim 15, wherein the first magnetic skyrmion has a core with perpendicular anisotropy, and wherein the second magnetic skyrmion has a core with perpendicular magnetic anisotropy that is antiparallel to the perpendicular anisotropy of the first magnetic skyrmion.

19. A method of fabricating a two-terminal magnetic memory device, the method comprising:
forming a material layer stack over a first electrode, the forming comprising:
depositing a free magnet layer above the first electrode;
depositing a tunnel barrier layer over the free magnet layer;
depositing a fixed magnet layer over the tunnel barrier layer;
depositing a synthetic antiferromagnetic (SAF) structure over the fixed magnet layer, wherein the SAF structure comprises a magnetic skyrmion;
forming a second electrode layer over the SAF structure; and
etching the material layer stack.

20. The method of claim 19, wherein depositing the SAF structure further comprises:

depositing, over the fixed magnet layer, a first magnetic layer comprising a first magnetic skyrmion having a first polarity;
depositing a coupling layer over the first magnetic layer; and
depositing a second magnetic layer over the coupling layer, the second magnetic layer comprising a second magnetic skyrmion having a second polarity, opposite the first polarity.

* * * * *